US012785714B2

(12) United States Patent
Palm et al.

(10) Patent No.: US 12,785,714 B2
(45) Date of Patent: Nov. 3, 2026

(54) TIME-DOMAIN ANALOG-TO-DIGITAL CONVERTER

(71) Applicant: Telefonaktiebolaget LM Ericsson (publ), Stockholm (SE)

(72) Inventors: Mattias Palm, Bara (SE); Roland Strandberg, Furulund (SE); Hanie Ghaedrahmati, Malmö (SE); Henrik Sjöland, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 101 days.

(21) Appl. No.: 18/880,602

(22) PCT Filed: Jul. 8, 2022

(86) PCT No.: PCT/EP2022/069178

§ 371 (c)(1),
(2) Date: Jan. 2, 2025

(87) PCT Pub. No.: WO2024/008314

PCT Pub. Date: Jan. 11, 2024

(65) Prior Publication Data

US 2025/0392320 A1 Dec. 25, 2025

(51) Int. Cl.
*H03M 1/54* (2006.01)
*G04F 10/00* (2006.01)

(52) U.S. Cl.
CPC ............ *H03M 1/54* (2013.01); *G04F 10/005* (2013.01)

(58) Field of Classification Search
CPC ............ H03M 1/60; H03M 1/50; H03M 1/84; H03M 1/82; G04F 10/005
(Continued)

(56) References Cited

U.S. PATENT DOCUMENTS 8,218,707 B2 * 7/2012 Mai ........................ H03L 7/0891 375/376
8,373,444 B2 2/2013 Lee et al.
(Continued)

FOREIGN PATENT DOCUMENTS

CN 114337258 B 9/2022
CN 115102548 A 9/2022
(Continued)

OTHER PUBLICATIONS

Hassanpourghadi, Mohsen, et al., "A 2-way 7.3-bit 10 GS/s Time-based Folding ADC with Passive Pulse-Shrinking Cells", 2019 IEEE Custom Integrated Circuits Conference (CICC), doi: 10.1109/CICC.2019.8780180, 2019, 1-4.
(Continued)

*Primary Examiner* — Peguy Jean Pierre
(74) *Attorney, Agent, or Firm* — Murphy, Bilak & Homiller, PLLC

(57) ABSTRACT

An ADC (50) is disclosed. It has two VTCs (110*a*, 110*b*) for converting a first and a second input voltage, respectively, to pulses with delays corresponding to the magnitudes of these voltages. It further has a pulse-detector circuit (120) coupled to outputs (114*a*, 114*b*) of the two VTCs (110*a*, 110*b*). The pulse-detector circuit (120) is configured to make a transition from a first logic state ('0') to a second logic state ('F) at a first output (124*a*) of the pulse-detector circuit (120) in response to the start of the pulse from one of the VTCs (110*a*) and to make a transition from the first logic state ('0') to the second logic state ('F) at a second output (124*b*) of the pulse-detector circuit (120) in response to the start of the pulse from the other VTC. Furthermore, the pulse-detector circuit (120) is configured to reset both the first and the second output (124*a*, 124*b*) to the first logic state ('0') in response to both the first output (124*a*) and the second output (124*b*) of the pulse-detector circuit (120) being set in
(Continued)

the second logic state ('1'). The ADC (50) further has a first TDC (130*a*) coupled to the first output (124*a*) of the pulse-detector circuit (120) and a second TDC (130*b*) coupled to the second output (124*b*) of the pulse-detector circuit (120).

20 Claims, 6 Drawing Sheets

(58) Field of Classification Search
USPC .......................................................... 341/155
See application file for complete search history.

(56) References Cited

U.S. PATENT DOCUMENTS

| | | | | |
|---|---|---|---|---|
| 9,323,226 | B1 | 4/2016 | Waltari | |
| 9,484,918 | B1 * | 11/2016 | Kuan | H01Q 3/2682 |
| 2014/0055583 | A1 * | 2/2014 | Kato | H04N 23/555 341/137 |
| 2024/0178857 | A1 * | 5/2024 | Hyun | H03M 1/38 |

FOREIGN PATENT DOCUMENTS

| | | | |
|---|---|---|---|
| WO | 2024230922 | A1 | 11/2024 |
| WO | 2024230923 | A1 | 11/2024 |

OTHER PUBLICATIONS

Henzler, Stephan, "Time-to-Digital Converters", Part of the Springer Series in Advanced Microelectronics book series (Microelectr., vol. 29), 2010, 1-133.
Iizuka, Tetsuya, et al., "A Fine-Resolution Pulse-Shrinking Time-to-Digital Converter with Completion Detection utilizing Built-In Offset Pulse", IEEE Asian Solid-State Circuits Conference, Toyama, Japan, Nov. 7-9, 2016, 1-4.
Karmakar, Arijit, et al., "A 0.18 pJ/Step Time-Domain 1st Order [Delta][Sigma] Capacitance-to-Digital Converter in 65-nm CMOS", 2019 IEEE International Symposium on Circuits and Systems (ISCAS), XP033933153, ISSN: 2158-1525, DOI: 10.1109/ISCAS51556.2021.9401505 ISBN: 978-1-7281-3320-1, May 22, 2021, 1-5.
Lin, Chin-Yu, et al., "A 200-MS/s Phase-Detector-Based Comparator With 400-μVrms Noise", IEEE Transactions on Circuits and Systems—II: Express Briefs, vol. 63, No. 9, Sep. 2016, 813-817.
Lyu, Yifan, et al., "A 4-GS/s 39.9-dB SNDR 11.7-mW Hybrid Voltage-Time Two-Step ADC With Feed-Forward Ring Oscillator-Based TDCs", IEEE Solid-State Circuits Letters, vol. 2, No. 9, Sep. 2019, 163-165.
MacPherson, Andrew Robert, "A Time-Based 5GS/s CMOS Analog-to-Digital Converter", PRISM: University of Calgary's Digital Repository, doi:10.11575/PRISM/25056, http://hdl.handle.net/11023/750, doctoral thesis, Jun. 3, 2013, 1-168.
Mostafa, Hassan, et al., "Highly-linear voltage-to-time converter (VTC) circuit for time-based analog-to-digital converters (T-ADCs)", 2013 IEEE 20th International Conference on Electronics, Circuits, and Systems (ICECS), Dec. 8, 2013, 149-152.
Oh, Tak-Jun, et al., "A 110-nm CMOS 0.7-V Input Transient-Enhanced Digital Low-Dropout Regulator With 99.98% Current Efficiency at 80-mA Load", IEEE Transactions on Very Large Scale Integration (VSLI) Systems, vol. 23, No. 7, Jul. 2015, 1281-1286.
Toraskar, Deepali Dinkar, et al., "Time Domain ADC using Pulse Shrinking TDC", 2016 International Conference on Circuits, Controls, Communications and Computing (14C), 2016, 1-4.
Yuan, Fei, "Design techniques for voltage-to-time converters with nonlinearity emphasis", Analog Integrated Circuits and Signal Processing, vol. 111, 2022, 371-386.
Zhang, Minglei, et al., "An 8-Bit 10-GS/s 16x Interpolation-Based Time-Domain ADC With <1.5-ps Uncalibrated Quantization Steps", IEEE Journal of Solid-State Circuits, vol. 55, No. 12, Dec. 2020, 3225-3235.

* cited by examiner

TIME-DOMAIN ANALOG-TO-DIGITAL CONVERTER

TECHNICAL FIELD

The present invention relates to a time-domain analog-to-digital converter.

BACKGROUND

A time-domain analog-to-digital converter (ADC) utilizes an intermediate conversion of an analog input sample, e.g. in the form of a voltage, into the time-domain for converting the input sample to the digital domain. One flavor of a time-domain ADC is implemented by a cascade of a voltage-to-time converter (VTC) and a time-to-digital converter TDC. The VTC is a circuit that takes in an analog voltage signal and produces a series of pulses where the delay on each pulse, with respect to an input clock signal, or the delay between pulses on two different output signal lines, is proportional to the input voltage at the time the pulse was generated. The VTC output is fed into a TDC, which measures the delay between pulse edges on two signals and converts the value to a digital representation.

The VTC can be implemented in various ways depending on requirements on linearity. The more linear VTCs tend to be those where the input signal is sampled on a capacitor and a constant current source discharges the capacitor, thereby resulting in an ideally linear decrease of the voltage on the capacitor. As the voltage reaches a threshold of a comparator, the comparator output toggles from zero to one (or from one to zero, depending on implementation). In the case of a differential ADC, there are two input voltages, the difference between which forms a differential input voltage. Such a differential ADC utilizes two VTCs as described above, one for each of the two input voltages. The differential input voltage is thereby converted into a time difference between the rising edges (or falling edges, depending on implementation) of the two comparator outputs.

SUMMARY

The inventors have realized that many TDC implementations suffer from poor linearity when the time differences, or time durations, to be converted are short. In a differential time-domain ADC as described above, this would e.g. be the case when the differential input voltage is close to 0 (or in other words, when the two input voltages are close to each other). The inventors have realized that this problem can be alleviated by means of a pulse-detector circuit, as defined in the claims, that is connected to the outputs of the two VTCs. The durations of output pulses generated at two outputs of the pulse-detector circuit are converted by two separate TDCs (one for each of the two outputs). Due to an inherent delay in the components of the pulse-detector circuit, these output pulses are guaranteed to have a certain non-zero minimum duration. This, in turn, alleviates the linearity problem of TDCs when converting short time durations, as the durations to be converted are not shorter than said minimum duration. The components in the pulse-detector circuit can be deliberately designed such that the minimum duration is suitable for the TDCs used.

According to a first aspect, there is provided ADC for converting samples of a differential input voltage formed by pairs of concurrent samples of a first input voltage and a second input voltage. The ADC comprises a differential input port comprising a first input terminal configured to receive the first input voltage and a second input terminal configured to receive the second input voltage. Furthermore, the ADC comprises a first voltage-to-time converter (VTC) configured to receive the first input voltage, a second VTC configured to receive the second input voltage, a pulse-detector circuit coupled to outputs of the first VTC and the second VTC and having a first output and a second output, a first TDC coupled to the first output of the pulse-detector circuit, and a second TDC coupled to the second output of the pulse-detector circuit. For each pair of concurrent samples of the first input voltage and the second input voltage, the first VTC is configured to generate a first pulse delayed an amount of time corresponding to the magnitude of the sample of the first input voltage and the second VTC is configured to generate a second pulse delayed an amount of time corresponding to the magnitude of the sample of the second input voltage. Furthermore, for each pair of concurrent samples of the first input voltage and the second input voltage, the pulse-detector circuit is configured to make a transition from a first logic state to a second logic state at the first output of the pulse-detector circuit in response to the start of the first pulse, make a transition from the first logic state to the second logic state at the second output of the pulse-detector circuit in response to the start of the second pulse, and in response to both the first output and the second output of the pulse-detector circuit being set in the second logic state, reset both the first and the second output to the first logic state. Thereby, a third pulse is generated at the first output of the pulse-detector circuit and a fourth pulse is generated at the second output of the pulse-detector circuit. The first TDC is configured to receive the third pulse and generate a first digital value corresponding to the duration of the third pulse. The second TDC is configured to receive the fourth pulse and generate a second digital value corresponding to the duration of the fourth pulse.

In some embodiments, the first digital value and the second digital value form an output sample of the ADC.

In some embodiments, the ADC comprises a circuit configured to generate an output sample of the ADC in response to the first digital value and the second digital value. For instance, the output sample may be the difference between the first digital value and the second digital value.

In some embodiments, each of the first TDC and the second TDC is a pulse-shrinking TDC.

The pulse-detector circuit may comprise a first flip-flop and a second flip-flop, each having a data input, a clock input, a reset input, and an output. The data input of each of the first flip-flop and the second flip-flop may be configured to receive a constant signal corresponding to the second logic state. The clock input of the first flip-flop may be configured to receive the first pulse. The clock input of the second flip-flop may be configured to receive the second pulse. The output of the first flip-flop may be connected to the first output of the pulse-detector circuit. The output of the second flip-flop may be connected to the second output of the pulse-detector circuit. The pulse-detector circuit may comprise a logic circuit having a first input connected to the output of the first flip-flop, a second input connected to the output of the second flip-flop, and an output connected to the reset inputs of the first flip-flop and the second flip-flop for resetting the first flip-flop and the second flip-flop in response to the outputs of both the first flip-flop and the second flip-flop being set in the second logic state.

The logic circuit may be further configured to reset the first flip-flop and the second flip-flop in response to a reset pulse. For instance, the ADC may comprise circuitry configured to provide said reset pulse in preparation of converting each sample.

The first VTC may comprise a first capacitor configured to, for each sample of the first input voltage, be charged to the voltage value of that sample of the first input voltage during a first phase of operation. The first VTC may comprise a first current source configured to discharge or charge the first capacitor during a subsequent second phase of operation. The first VTC may comprise a first comparator circuit configured to compare the voltage across the first capacitor with a first reference voltage and to generate the first pulse at an output of the first comparator circuit.

The second VTC may comprise a second capacitor configured to, for each sample of the second input voltage, be charged to the voltage value of that sample of the second input voltage during the first phase of operation. The second VTC may comprise a second current source configured to discharge or charge the second capacitor during the second phase of operation. The second VTC may comprise a second comparator circuit configured to compare the voltage across the second capacitor with the first or a second reference voltage and to generate the second pulse at an output of the second comparator circuit.

According to a second aspect, there is provided an ADC. The ADC comprises a first and a second VTC, each having an input terminal and an output terminal and each comprising a sampling capacitor having a first terminal and a second terminal, wherein the second terminal is connected to a signal ground node, a sampling switch connected between the input terminal of the VTC and the first terminal of the sampling capacitor, a charge-transfer circuit comprising a series connection of a current source and a switch connected to the first terminal of the capacitor, and a comparator circuit having a first input terminal connected to the first terminal of the capacitor, a second input terminal configured to receive a reference voltage, and an output terminal connected to the output terminal of the VTC. The ADC comprises a pulse-detector circuit. The pulse detector circuit comprises a first flip-flop and a second flip-flop, each having a data input, a clock input, a reset input, and an output. The output of each of the first and second flip-flop can be in a first logic state or a second logic state. Each of the first and the second flip-flop is configured to reset its output to the first logic state in response to a reset signal at its reset input. The pulse-detector circuit further comprises a logic circuit having a first input, a second input, and an output. The data input of each of the first flip-flop and the second flip-flop is configured to receive a constant signal corresponding to the second logic state. The clock input of the first flip-flop is connected to the output terminal of the first VTC. The clock input of the second flip-flop is connected to the output terminal of the second VTC. The output of the first flip-flop is connected to a first output of the pulse-detector circuit. The output of the second flip-flop is connected to a second output of the pulse-detector circuit. The first input of the logic circuit is connected to the output of the first flip-flop, the second input of the logic circuit is connected to the output of the second flip-flop, and the output of the logic circuit is connected to the reset inputs of the first and the second flip-flop. The logic circuit is configured to generate the reset signal in response to both of its first input and its second input being set in the second logic state. The ADC comprises a first TDC connected to the first output of the pulse-detector circuit and a second TDC connected to the second output of the pulse-detector circuit.

According to a third aspect, there is provided a receiver circuit comprising the ADC of the first or second aspect.

According to a fourth aspect, there is provided an integrated circuit comprising the ADC of the first or second aspect.

According to a fifth aspect, there is provided an electronic apparatus comprising the ADC of the first or second aspect. The electronic apparatus may be a communication apparatus, such as (but not limited to) a wireless communication device or a base station for a cellular communications system.

Further embodiments are defined in the dependent claims. It should be emphasized that the term "comprises/comprising" when used in this specification is taken to specify the presence of stated features, integers, steps, or components, but does not preclude the presence or addition of one or more other features, integers, steps, components, or groups thereof.

DETAILED DESCRIPTION

Figure 1:
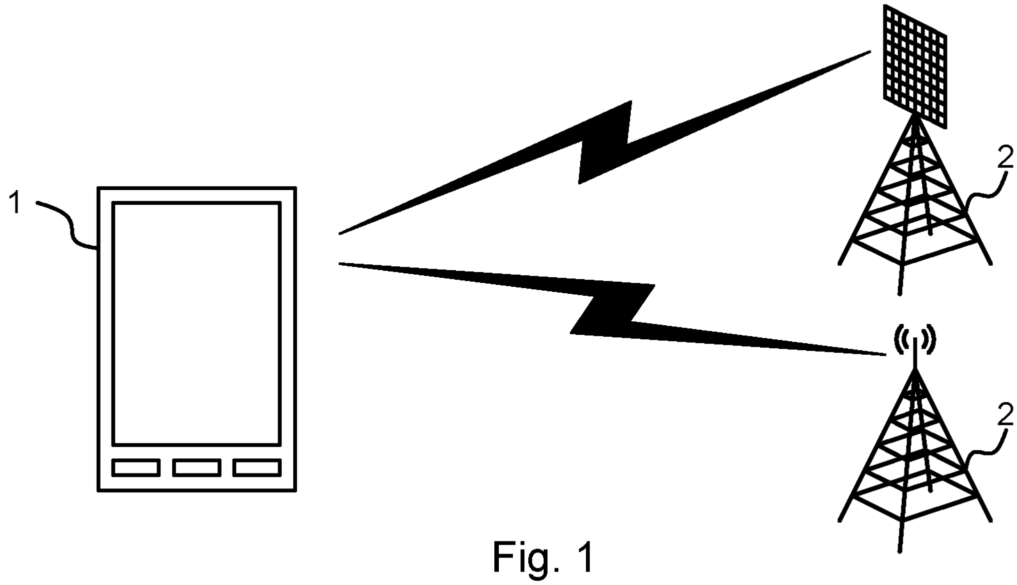
FIG. 1 illustrates a communication environment.

FIG. 1 illustrates a communication environment wherein embodiments of the present invention may be employed. A wireless communication device 1, or wireless device 1 for short, of a cellular communications system is in wireless communication with a radio base station 2 of the cellular communications system. The wireless device 1 may be what is generally referred to as a user equipment (UE). The wireless device 1 is depicted in FIG. 1 as a mobile phone, but may be any kind of device with cellular communication capabilities, such as a tablet or laptop computer, machine-type communication (MTC) device, or similar. Furthermore, a cellular communications system is used as an example throughout this disclosure. However, embodiments of the present invention may be applicable in other types of systems as well, such as but not limited to WiFi systems.

The radio base station 2 and wireless device 1 are examples of what in this disclosure is generically referred to as communication apparatuses. Embodiments are described below in the context of a communication apparatus in the form of the radio base station 2 or wireless device 1. However, other types of communication apparatuses can be considered as well, such as a WiFi access point or WiFi enabled device.

Figure 2:
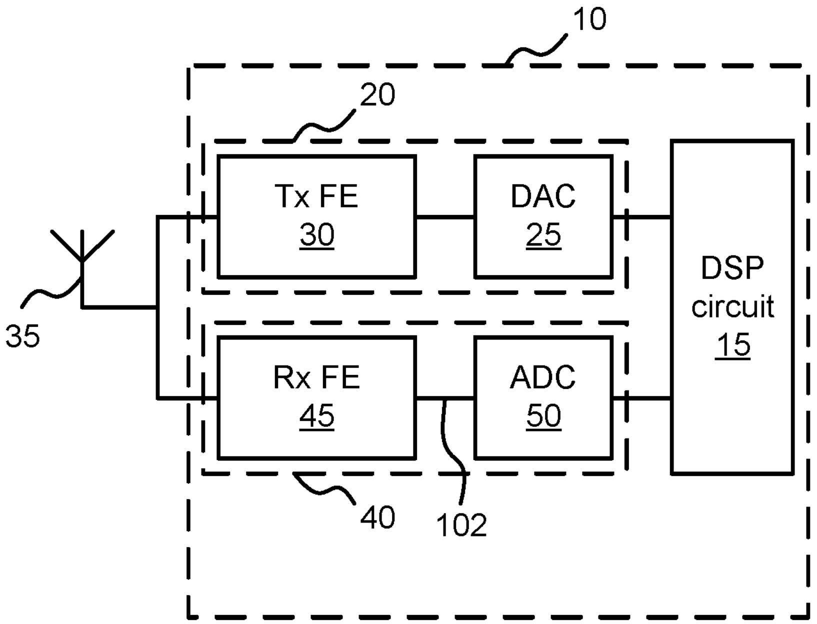
FIG. 2 illustrates a transceiver circuit.

FIG. 2 is a block diagram of an embodiment of a transceiver circuit 10, which can be comprised in a communication apparatus, such as the radio base station 2 or the wireless device 1. In the embodiment illustrated in FIG. 2, the transceiver circuit 10 comprises a digital signal processing (DSP) circuit 15. The DSP circuit 15 may e.g. be what is commonly referred to as a baseband processor. The DSP circuit 15 may e.g. be configured to perform various digital signal processing tasks, such as one or more of coding, decoding, modulation, demodulation, fast Fourier transform (FFT), inverse FFT (IFFT), mapping, demapping, etc.

Furthermore, in the embodiment illustrated in FIG. 2, the transceiver circuit 10 comprises a transmitter circuit 20. The transmitter circuit 20 comprises a digital-to-analog converter (DAC) 25. The DAC 25 is connected to the DSP circuit 15 and configured to receive, as an input signal of the DAC 25, a digital representation of a signal to be transmitted from the DSP circuit 15. The DAC 25 is further configured to convert the signal to be transmitted to an analog representation, which is an output signal of the DAC 25. The transmitter circuit 20 also comprises a transmitter (Tx) frontend (FE) circuit 30 connected between the DAC 25 and an antenna 35. The Tx FE circuit 30 is configured to transform the output signal from the DAC to a format suitable for transmission via the antenna 35. This may include operations such as frequency upconversion, filtering, and/or amplification. The Tx FE circuit 30 may comprise one or more mixers, filters, and/or amplifiers, such as power amplifiers (PAs), to perform such operations. The design of such Tx FE circuits is, per se, well known to a person skilled in the field of radio transceiver design, and is not discussed herein in any further detail.

Moreover, in the embodiment illustrated in FIG. 2, the transceiver circuit 10 comprises a receiver circuit 40. The receiver circuit 40 comprises a receiver (Rx) FE circuit 45 connected to the antenna 35. Furthermore, the receiver circuit 40 comprises an ADC 50. The ADC 50 is connected between the Rx FE circuit 45 and the DSP circuit 15. The Rx FE circuit 45 is configured to transform a signal received via the antenna 35 to a format suitable to be input to the ADC 50. This may include operations such as frequency downconversion, filtering, and/or amplification. The Rx FE circuit 45 may comprise one or more mixers, filters, and/or amplifiers, such as low-noise amplifiers (LNAs), to perform such operations. The design of such Rx FE circuits is, per se, well known to a person skilled in the field of radio transceiver design, and is not discussed herein in any further detail. The ADC 50 is configured to receive its (analog) input signal from the Rx FE circuit, and convert it to a digital representation to generate the digital output signal of the ADC 50. This digital output signal of the ADC 50 is input to the DSP circuit 15 for further digital signal processing. In some embodiments, the ADC 50 may be configured to receive a radio-frequency (RF) input signal, without any preceding frequency downconversion.

In embodiments of this disclosure, the ADC 50 is implemented as a time-domain ADC further described below. Furthermore, embodiments of the ADC 50 disclosed herein are configured to convert samples of a differential input voltage. Said samples of the differential input voltage are formed by pairs Va[n], Vb[n] of concurrent samples Va[n] and Vb[n] of a first input voltage Va and a second input voltage Vb. A difference between the first input voltage Va and the second input voltage Vb forms the value of differential input voltage of the ADC 50. For instance, Va may be a positive component and Vb may be a negative component, respectively, of the differential input voltage, or vice versa. Samples Va[n] and Vb[n] having the same value of the sequence index n are sampled at the same sampling time and referred to herein as concurrent samples. The sampling time for sequence index is below referred to as nT, where T is the sampling period of the ADC 50. However, this is a mere example used for simplicity. For instance, nonuniform sampling may be used, in which case the ADC has no fixed sampling period.

Figure 3:
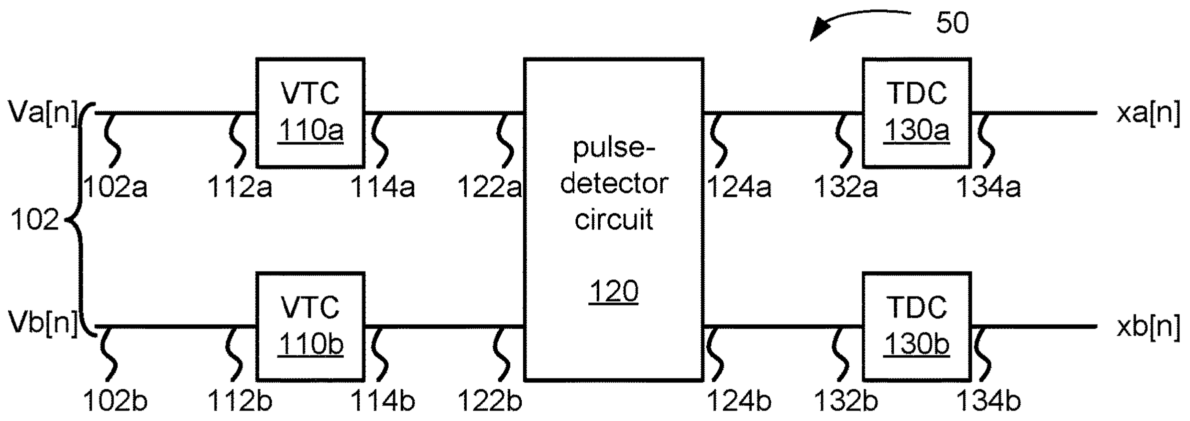
FIG. 3 is a block diagram of an ADC.

FIG. 3 illustrates an embodiment of the ADC 50. It has a differential input port 102. The differential input port 102 comprises a first input terminal **102*a* configured to receive a series of samples of a first input voltage Va[n], where n is a sequence index. The differential input port 102 further comprises a second input terminal 102*b*** configured to receive a series of samples of a second input voltage Vb[n].

The ADC 50 comprises a first voltage-to-time converter (VTC) **110*a* configured to receive the first input voltage Va[n]. In FIG. 3, the first VTC 110*a* has an input terminal 112*a* connected to the first input terminal 102*a* of the ADC 50 for this purpose. The first VTC 110*a* further has an output 114*a*. Furthermore, the ADC 50 comprises a second VTC 110*b* configured to receive the second input voltage Vb[n]. In FIG. 3, the second VTC 110*b* has an input terminal 112*b* connected to the second input terminal 102*b* of the ADC 50 for this purpose. The second VTC 110*b* further has an output 114*b*. The functionality of the VTCs 110*a* and 110*b*** is further described below.

The ADC 50 comprises a pulse-detector circuit 120 coupled to the outputs **114*a* and 114*b* of the first VTC 110*a* and the second VTC 110*b*. In FIG. 3, the pulse-detector circuit 120 has a first input 122*a* connected to the output 114*a* of the first VTC 110*a* and a second input 122*b* connected to the output 114*b* of the second VTC 110*b* for this purpose. Furthermore, the pulse-detector circuit 120 has a first output 124*a* and a second output 124*b*. The functionality of the pulse-detector circuit 120** is further described below.

Furthermore, the ADC 50 comprises a first time-to-digital converter (TDC) **130*a* coupled to the first output 124*a* of the pulse-detector circuit 120. In FIG. 3, the first TDC 130*a* has an input 132*a* connected to the first output 124*a* of the pulse-detector circuit 120 for this purpose. Moreover, the first TDC 130*a* has an output 134*a***.

The ADC 50 further comprises a second TDC **130*b* coupled to the second output 124*b* of the pulse-detector circuit 120. In FIG. 3, the second TDC 130*b* has an input 132*b* connected to the second output 124*b* of the pulse-detector circuit 120 for this purpose. Furthermore, the second TDC 130*b* has an output 134*b***.

According to some embodiments, the VTCs **110*a* and 110*b*, the pulse-detector circuit 120, and the TDCs 130*a* and 130*b* are configured to operate as follows. The operation is described for a pair of concurrent samples Va[n], Vb[n] (i.e. for a given value of n) of the first input voltage Va and the second input voltage Vb. The operation is the same for each such pair of concurrent samples Va[n], Vb[n] (i.e. for each value of n). The operation is illustrated with pulse waveforms in FIG. 4. Reference is made below to a first logic state and a second logic state. In the examples presented, the first logic state is considered to be '0', generally represented with a "low" voltage level (such as 0V), and the second logic state is considered to be '1', generally represented with a "high" voltage level (i.e. a voltage level higher than the "low" voltage level, e.g. equal to a supply voltage of the circuitry). However, in some embodiments, the first logic state and the second logic state could equally well be '1' and '0', respectively, with suitable modifications of the circuitry as would be readily understood by a skilled person. Furthermore, in FIG. 4, the pulses start with a rising edge and end with a falling edge. However, in some embodiments, pulses that are inverted with respect to those shown in FIG. 4** may be used, i.e. starting with a falling edge and ending with a rising edge.

In some embodiments, the first VTC 110*a* is configured to perform the sampling of the first input voltage Va. That is, in these embodiments, the voltage Va at the input 112*a* of the first VTC 110*a* is a time-continuous voltage. In other embodiments, the sampling may be performed by a sampling circuit (not shown in the drawings) preceding the first VTC 110*a*. That is, in these embodiments, the voltage Va at the input 112*a* of the first VTC 110*a* is a time discrete (e.g. piecewise constant) voltage.

Similarly, in some embodiments, the second VTC 110*b* is configured to perform the sampling of the second input voltage Vb. That is, in these embodiments, the voltage Vb at the input 112*b* of the second VTC 110*b* is a time-continuous voltage. In other embodiments, the sampling may be performed by a sampling circuit (not shown in the drawings) preceding the second VTC 110*b*. That is, in these embodiments, the voltage Vb at the input 112*b* of the second VTC 110*b* is a time discrete (e.g. piecewise constant) voltage.

Figure 4:
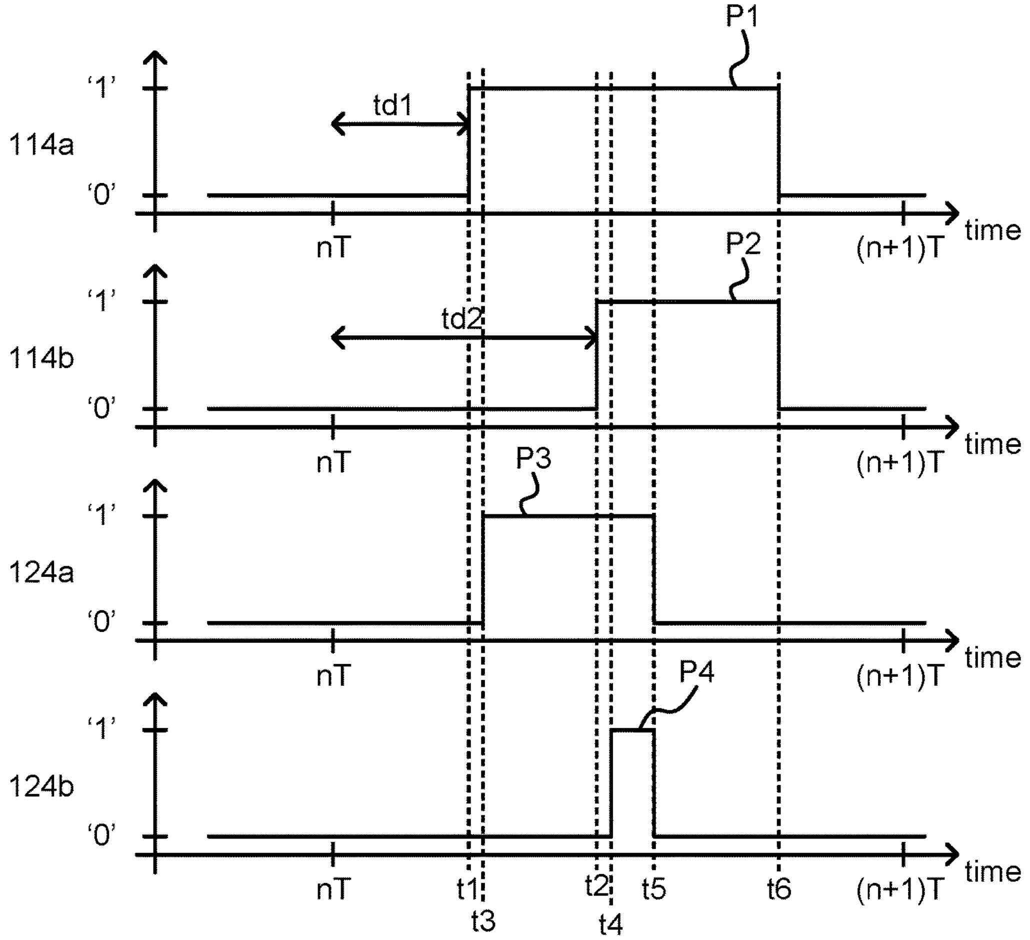
FIG. 4 shows pulse waveforms.

The first VTC 110*a* is configured to generate a first pulse P1 (see FIG. 4) delayed an amount of time td1 that corresponds to the magnitude of the sample of the first input voltage Va[n]. Ideally, the delay td1=kVa[n]+m, where k and m are constants. However, such an exact ideal relation is not possible in practice due to manufacturing tolerances, noise, etc. In FIG. 4, the starting time for the pulse P1 is labeled t1.

Similarly, the second VTC 110*b* is configured to generate a second pulse P2 (see FIG. 4) delayed an amount of time td2 corresponding to the magnitude of the sample of the second input voltage Vb[n]. Again, ideally, the delay td2=kVb[n]+m with the same k and m as for td1. Again, such an exact ideal relation is not possible in practice due to manufacturing tolerances, noise, etc. In FIG. 4, the starting time for the pulse P2 is labeled t2. Furthermore, in FIG. 4, t2 occurs after t1. Of course, which of t1 and t2 is first depends on the values of the input voltage Va[n] and Vb[n]. As illustrated in FIG. 4, the first and second pulses P1 and P2 are ended before the next sample time instant (n+1)T. In FIG. 4, this happens at a time instant labeled t6.

In FIG. 4, the delays td1 and td2 are measured from the sampling time instant nT. However, since differential signals are considered, the signal is represented by the difference between td1 and td2, so any time instant other than nT could be used as reference as well.

In a conventional differential time-domain ADC as outlined in the background section, a TDC would use one of P1 and P2, whichever comes first, as a start signal, and the other one of P1 and P2 as a stop signal, and thereby measure the absolute difference between td1 and td2 (and use some additional logic circuitry that keeps track of the sign of the difference). If this difference is small, many known TDC implementations have difficulties to accurately measure the difference, resulting in an overall poor linearity of such a conventional differential time-domain ADC. According to embodiments of the ADC 50 disclosed herein, this problem is alleviated by means of the pulse-detector circuit 120, which guarantees a certain (nonzero) minimum duration of time for the TDCs 130*a* and 130*b* to measure, as further described below.

The pulse-detector circuit 120 is configured to make a transition from the first logic state ('0') to the second logic state ('1') at the first output 124*a* of the pulse-detector circuit 120 in response to the start of the first pulse P1, as illustrated in FIG. 4. In FIG. 4, this happens at a time instant labeled t3. Furthermore, pulse-detector circuit 120 is configured to make a transition from the first logic state ('0') to the second logic state ('1') at the second output 124*b* of the pulse-detector circuit 120 in response to the start of the second pulse P2. In FIG. 4, this happens at a time instant labeled t4. Moreover, the pulse-detector circuit is configured to reset both its first and its second output 124*a*, 124*b* to the first logic state ('0') in response to both the first output 124*a* and the second output 124*b* of the pulse-detector circuit 120 being set in the second logic state ('1'). In FIG. 4, this happens at a time instant labeled t5.

Thereby, as illustrated in FIG. 4, a third pulse P3 is generated at the first output 124*a* of the pulse-detector circuit and a fourth pulse P4 is generated at the second output 124*b* of the pulse-detector circuit 120. The difference between the durations of the third pulse P3 and the fourth pulse P4 is a time-domain representation of the differential input voltage Va[n]−Vb[n]. Ideally, said difference is proportional to Va[n]−Vb[n].

The first TDC 130*a* is configured to receive the third pulse P3 and generate a first digital value xa[n] corresponding to the duration of the third pulse P3. The second TDC 130*b* configured to receive the fourth pulse P4 and generate a second digital value xb[n] corresponding to the duration of the fourth pulse P4.

Due to inherent delays in the electronic components used to implement the pulse-detector circuit, the reset of the outputs 124*a* and 124*b* of the pulse-detector circuit 120 does not occur instantaneously when both outputs 124*a* and 124*b* have been set to the second logic state ('1'). This means that the pulses P3 and P4 have a guaranteed minimum duration. In FIG. 4, it is the fourth pulse P4 that has this minimum duration (which is t5−t4), but depending on the values of Va[n] and Vb[n], it could instead be the third pulse P3 that has the minimum duration. Thus, the durations to be converted by the TDCs 130*a* and 130*b* are not shorter than said guaranteed minimum duration. This helps alleviate linearity problems that many TDCs experience when measuring and converting short time durations, e.g. since the TDCs 130*a* and 130*b* are operated in a region where the difference between their respective outputs is a relatively linear function of the difference in pulse lengths at their respective inputs, and thus also a relatively linear function of the differential input voltage Va[n]−Vb[n]. In this region, any non-linearity in the TDCs 130*a* and 130*b*, which would cause problems for shorter pulse durations, influences both TDCs 130*a* and 130*b* to the same extent, and thus cancels in the differential domain. It should be noted that the components in the pulse-detector circuit can be deliberately designed or dimensioned to provide a suitable value of said guaranteed minimum delay.

In some embodiments, the first digital value xa[n] and the second digital value xb[n] form an output sample of the ADC 50. That is, in these embodiments, the output of the ADC 50 is in the form of a vector with two elements, xa[n] and xb[n], i.e. a differential digital signal.

Figure 5:
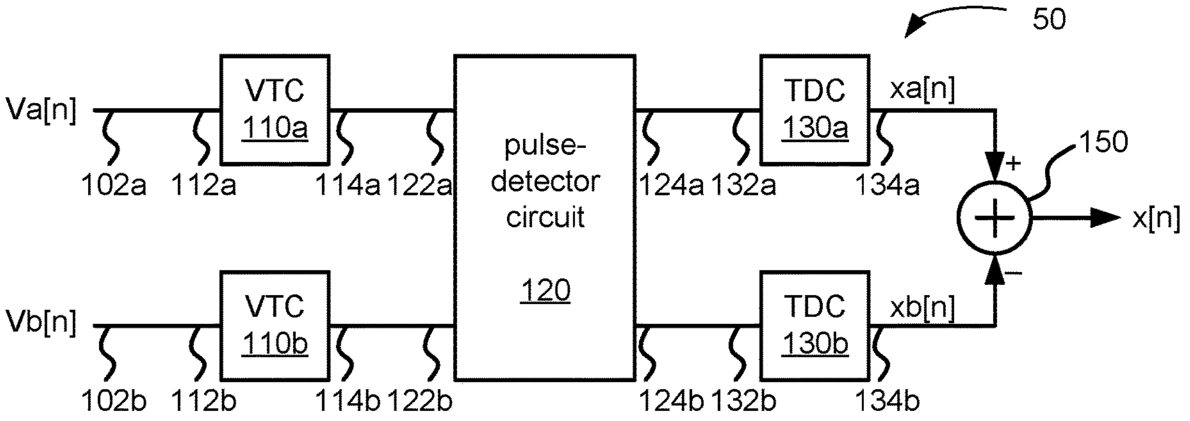
FIG. 5 is a block diagram of an ADC.

In other embodiments, the ADC 50 comprises a circuit 150 configured to generate an output sample x[n] of the ADC 50 in response to the first digital value xa[n] and the second digital value xb[n]. An example of this is illustrated in FIG. 5, where the output sample x[n] is the difference between the first digital value xa[n] and the second digital value xb[n]. Hence, the circuit 150 may be a subtraction circuit, or adder circuit with one positive and one negative input. However, other mathematical operations may be involved as well, including for instance gain and offset adjustments.

Figure 6:
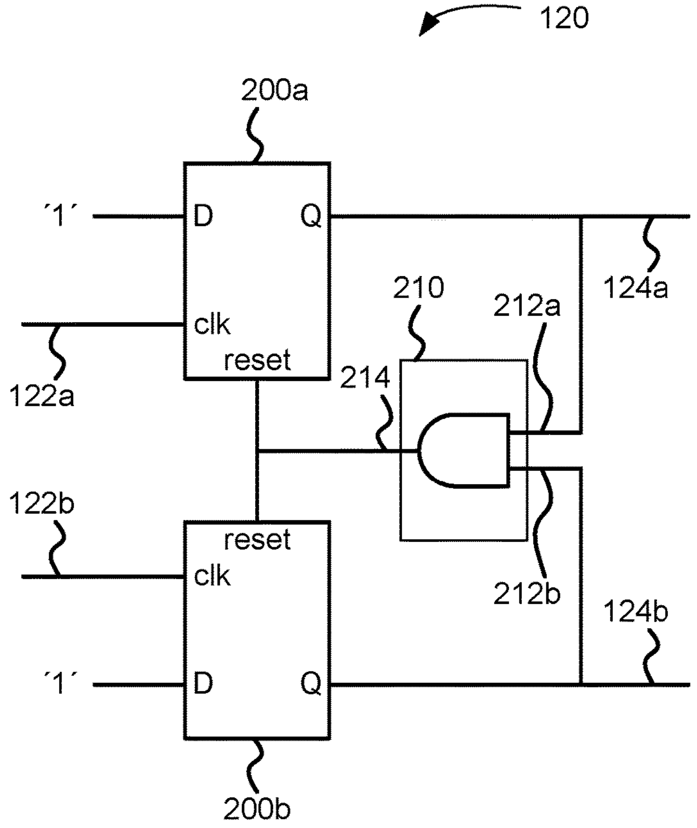
FIGS. 6 and 7 are a circuit diagrams of pulse-detector circuits.

FIG. 6 illustrates an embodiment of the pulse-detector circuit 120. In FIG. 6, the pulse-detector circuit 120 comprises a first flip-flop 200*a* and a second flip-flop 200*b*, each having a data input "D", a clock input "clk", a reset input "reset", and an output "Q". This type of flip-flop is commonly referred to as a "D flip-flop". The data input "D" of each of the first flip-flop 200*a* and the second flip-flop 200*b* is configured to receive a constant signal corresponding to the second logic state ('1').

The clock input "clk" of the first flip-flop 200*a* is configured to receive the first pulse P1. In FIG. 6, the clock input "clk" of the first flip-flop 200*a* is connected to the first input 122*a* of the pulse-detector circuit 120 for this purpose.

The clock input "clk" of the second flip-flop 200*b* is configured to receive the second pulse P2. In FIG. 6, the clock input "clk" of the second flip-flop 200*b* is connected to the second input 122*b* of the pulse-detector circuit 120 for this purpose.

Hence, the clock inputs of the flip-flops 200*a* and 200*b* are not driven by what would normally be considered as clock signals, but by the pulses P1 and P2, respectively. The term clock input is, however, used since this is common terminology for such inputs in flip-flops.

Furthermore, in FIG. 6, the output "Q" of the first flip-flop 200*a* is connected to the first output 124*a* of the pulse-detector circuit 120. Moreover, in FIG. 6, the output "Q" of the second flip-flop 200*b* is connected to the second output 124*b* of the pulse-detector circuit 120.

In the following discussion, the flip-flops 200*a* and 200*b* are assumed to be positive edge triggered, i.e. when a rising edge (or positive edge) is presented at their respective clock inputs "clk", they transfer the logic value present at their respective data inputs "D" to their respective outputs "Q". Let us further assume that the data outputs "Q" of both flip-flops 200*a* and 200*b* are initially in the first logic state ('0') and consider the pulse wave forms in FIG. 4 as an elucidating example. At time instant t1, a rising edge (i.e the start of pulse P1) is presented at the clock input "clk" of the first flip flop 200*a*. Since the data input "D" of the first flip-flop 200*a* is set to the second logic state ('1'), the output "Q" of the first flip-flop 200*a* makes a transition to the second logic state ('1') in response to this rising edge, which results in the start of pulse P3. In FIG. 4, this happens at time instant t3, slightly after t1 due to a slight delay in the first flip-flop 200*a*. Similarly, at time instant t2, a rising edge (i.e the start of pulse P2) is presented at the clock input "clk" of the second flip flop 200*b*. Since the data input "D" of the second flip-flop 200*b* is also set to the second logic state ('1'), the output "Q" of the second flip-flop 200*b* makes a transition to the second logic state ('1') in response to this rising edge, which results in the start of pulse P4. In FIG. 4, this happens at time instant t4, slightly after t2 due to a slight delay in the second flip-flop 200*b*.

In order to reset the first and second outputs 124*a*, 124*b* of the pulse-detector circuit 120 to the first logic state ('0') in response to both the first output 124*a* and the second output 124*b* of the pulse-detector circuit 120 being set in the second logic state ('1'), embodiment of the pulse-detector circuit 120 illustrated in FIG. 6 comprises a logic circuit 210. The logic circuit 210 has a first input 212*a* connected to the output "Q" of the first flip-flop 200*a* and a second input 212*b* connected to the output "Q" of the second flip-flop 200*b*. Furthermore, the logic circuit 210 has an output 214 connected to the reset inputs "reset" of the first flip-flop 200*a* and the second flip-flop 200*b* for resetting the first flip-flop 200*a* and the second flip-flop 200*b* in response to the outputs Q of both the first flip-flop 200*a* and the second flip-flop 200*b* being set in the second logic state ('1'). In FIG. 6, it is assumed that the reset inputs "reset" of the flip-flops 200*a* and 200*b* are "active high", i.e. that the flip-flops 200*a* and 200*b* are reset when a '1' is presented at their respective reset inputs "reset". Then, the functionality of the logic circuit 210 as described above can be implemented with an AND gate, as illustrated in FIG. 6. If, on the other hand, the reset inputs "reset" of the flip-flops 200*a* and 200*b* are "active low", i.e. the flip-flops 200*a* and 200*b* are reset when a '0' is presented at their respective reset inputs "reset", the functionality of the logic circuit 210 as described above can be implemented with a NAND gate. Other types of implementations can be used in other scenarios, e.g. if the first logic state would be '1' and the second logic state would be '0', etc.

An inherent delay in the logic circuit 210 and the flip-flops 200*a* and 200*b* provides the above-mentioned guaranteed minimum duration of the pulses P3 and P4. In order to provide a desired length of said guaranteed minimum duration, different design techniques can be used in the design of the logic circuit 210, as would be appreciated by a person skilled in the art of electronic design. For instance, with reference to FIG. 6, the AND gate can be intentionally designed to be "slow", e.g. using a relatively small width-over-length (W/L) ratios in the transistors in the AND gate, using current-starving techniques, and/or using a relatively high capacitive load at the output of the AND gate, etc. Alternatively or additionally, delay elements may be connected to the inputs and/or the output of the AND gate.

Figure 7:
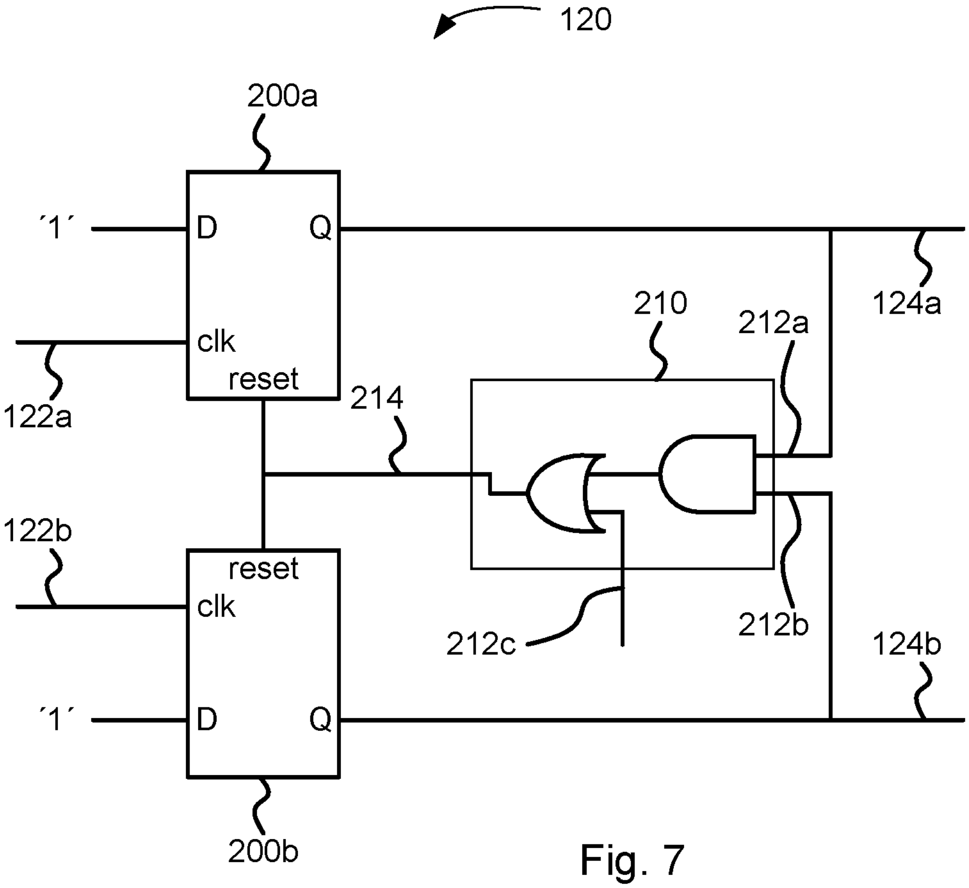

In some embodiments, the logic circuit 210 is further configured to reset the first flip-flop 200*a* and the second flip-flop 200*b* in response to a reset pulse. This can be useful if, for instance, the first or second flip-flop is stuck in an erroneous state, e.g. due to noise or an input signal outside the intended input range of the ADC 50, such that the "standard" reset mechanism based on both outputs 124*a* and 124*b* of the pulse-detector circuit being in the second logic state ('1') is not triggered for one or more samples. Then, by including circuitry (not shown in the drawings) in the ADC 50 configured to provide said reset pulse in preparation of converting each sample, it can be guaranteed that both outputs 124*a* and 124*b* of the pulse-detector circuit are initially in the first logic state ('0') for each sample. An example of such an embodiment of the logic circuit 210 is illustrated in FIG. 7. In FIG. 7, the logic circuit 210 comprises the AND gate shown in FIG. 6 and an OR gate. Instead of having the output of the AND gate connected to the reset inputs "reset" of the flip-flops 200*a* and 200*b*, the output of the AND gate is instead connected to a first input of the OR gate, and the output of the OR gate is connected to the reset inputs "reset" of the flip-flops 200*a* and 200*b*. A second input of the OR gate is connected to a third input 212*c* of the logic circuit 210. The third input 212*c* is configured to receive said reset pulse. With this configuration, the flip-flops 200*a* and 200*b* will be reset if said reset pulse is provided at the third input 212*c* or a '1' is provided at the output of the AND gate in the logic circuit 210.

Figure 8:
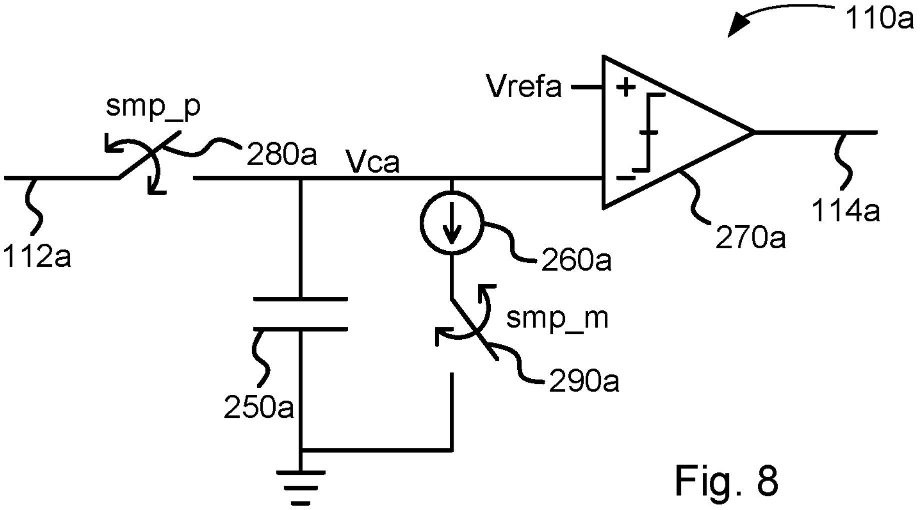
FIG. 8 is a circuit diagram of a VTC.

According to some embodiments, the first VTC 110*a* comprises a first capacitor 250*a* configured to, for each sample of the first input voltage Va[n], be charged to the voltage value of that sample of the first input voltage Va[n] during a first phase of operation (for that sample). Furthermore, according to some embodiments, the first VTC 110*a* comprises a first current source 260*a* configured to discharge the first capacitor 250*a* during a subsequent second phase of operation (for that sample). Moreover, according to some embodiments, the first VTC 110*a* comprises a first comparator circuit 270*a* configured to compare the voltage Vca across the first capacitor 250*a* with a first reference voltage Vrefa and to generate the first pulse P1 at an output of the first comparator circuit 270*a*. An example of such a configuration is illustrated in FIG. 8, where the first reference voltage Vrefa is provided to the positive input of the first comparator circuit 270*a*. In FIG. 8, one terminal of the first capacitor 250*a* is connected to a signal ground node. Furthermore, in FIG. 8, the other terminal of the first capacitor 250*a* is connected to a negative input of the first comparator circuit 270*a*. Moreover, in FIG. 8, a sampling switch 280*a* is connected between the input terminal 112*a* of the first VTC 110*a* and the negative input terminal of the first comparator circuit 270*a*. A sampling control signal smp_p controls the sampling switch 280*a* such that, for each sample, the sampling switch 280*a* is closed during said first phase of operation and open during said second phase of operation. The sampling control signal smp_p can also be used as the above-mentioned reset pulse provided to the third input 212*c* (FIG. 7) of the logic circuit 210 in some embodiments. For the embodiment illustrated in FIG. 8, the voltage Va provided at the input terminal 112*a* of the first VTC 110*a* can be either time continuous or time discrete (e.g. piecewise constant). In the case of a time-continuous voltage Va, said sample Va[n] is the value of Va at the end of the first phase of operation.

In FIG. 8, the first current source 260*a* is connected in series with a switch 290*a* between the negative input of the first comparator circuit 270*a* and the signal ground node. A control signal smp_m controls the switch 290*a* such that, for each sample, the switch 290*a* is open during said first phase of operation and closed during said second phase of operation. Thereby, during the second phase of operation, the first capacitor 250*a* is gradually discharged and the voltage Vca across the first capacitor is thus gradually reduced. When it reaches below the first reference voltage Vrefa, a transition is made at the output of the first comparator circuit 270*a*, which is the start of the first pulse P1.

Figure 9:
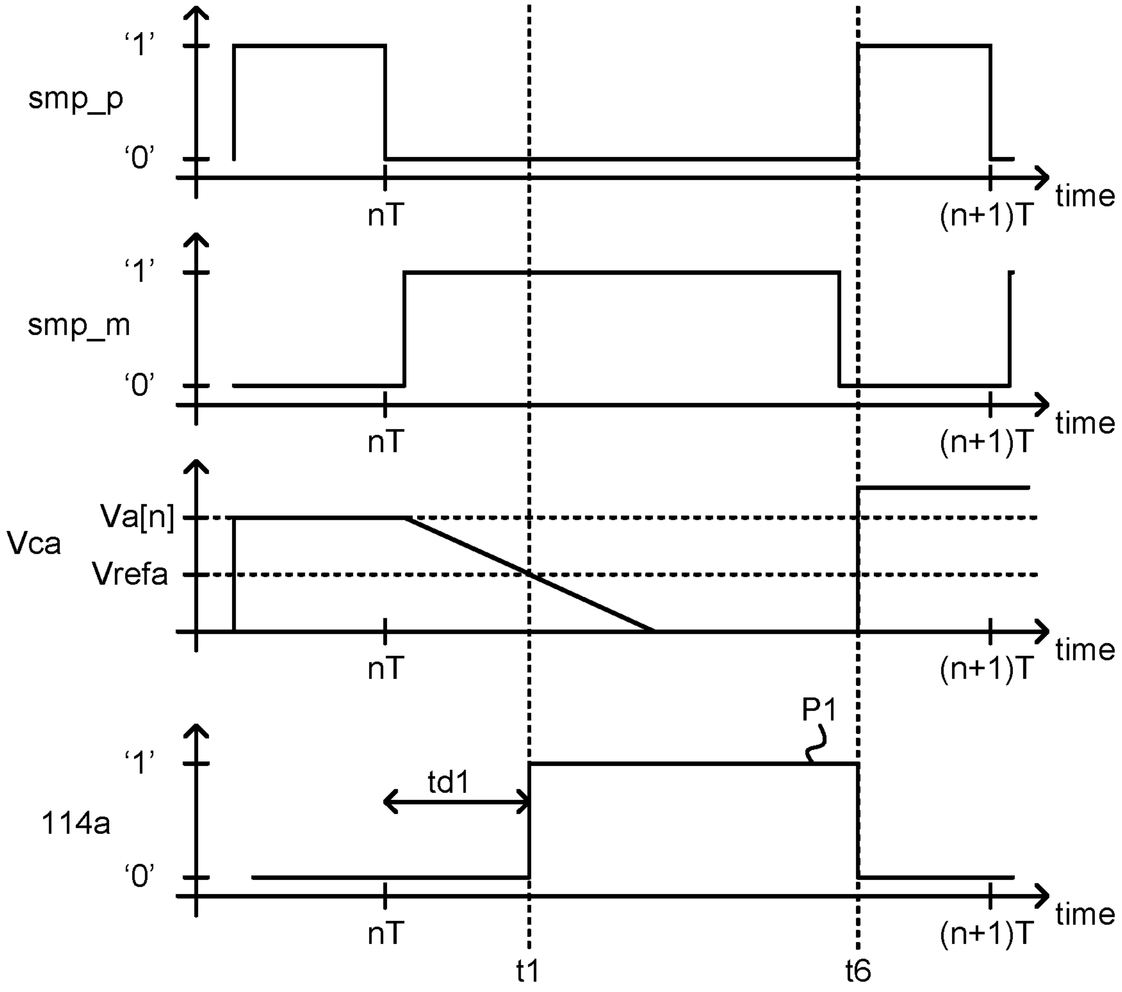
FIG. 9 shows waveforms.

The operation of the first VTC as described above is illustrated with some waveforms in FIG. 9 for the sample Va[n]. The first phase of operation corresponds to the time interval during which the sampling control signal smp_p is '1'. In FIG. 9, the sampling-time instant nT is defined as the end of the first phase of operation, i.e. at the falling edge of smp_p. The second phase of operation corresponds to the time interval during which the control signal smp_m is '1'. In FIG. 9, the first phase of operation and the second phase of operation are non-overlapping, with some short guard time intervals between the first phase of operation and the second phase of operation, and between the second phase of operation and the first phase of operation for the next sample.

For simplicity of illustration, it is assumed in FIG. 9 that Va is constant during the first phase of operation, during which the voltage Vca across the first capacitor 250*a* is set to Va[n]. During the second phase of operation, the voltage Vca is decreased, ideally at a constant rate, and when it crosses Vrefa, a transition is made at the output of the first comparator circuit 270*a*, which is the start of the first pulse P1, as mentioned above.

At the next rising edge of smp_p, the first capacitor 150*a* is charged to the next sample Va[n+1] of Va. This naturally resets the output of the first comparator circuit 270*a* and ends the first pulse P1 in preparation for processing of the next sample Va[n+1].

According to some embodiments, the second VTC 110*b* has a similar or identical design as the first VTC 110*a*. For example, according to some embodiments, the second VTC 110*b* comprises a second capacitor 250*b* configured to, for each sample of the second input voltage Vb[n], be charged to the voltage value of that sample of the second input voltage Vb[n] during the first phase of operation. Furthermore, according to some embodiments, the second VTC 110*b* comprises a second current source 260*b* configured to discharge the second capacitor 250*b* during the second phase of operation. Moreover, according to some embodiments, the second VTC 110*b* comprises a second comparator circuit 270*b* configured to compare the voltage Vcb across the second capacitor 250*b* with the first reference voltage Vrefa or a second reference voltage Vrefb and to generate the second pulse P2 at an output of the second comparator circuit 270*b*. Using the same reference voltage Vrefa in both the first VTC 110*a* and the second VTC 110*b* has the benefit of a relatively simple design and no need to generate multiple reference voltages for the comparator circuits 270*a* and 270*b*. Using different reference voltages Vrefa and Vrefb in the first VTC 110*a* and the second VTC 110*b* has the benefit of providing more degrees of freedom in calibrating the two VTCs 110*a* and 110*b*, e.g. to compensate for a mismatch between the comparator circuits 270*a* and 270*b*.

Figure 10:
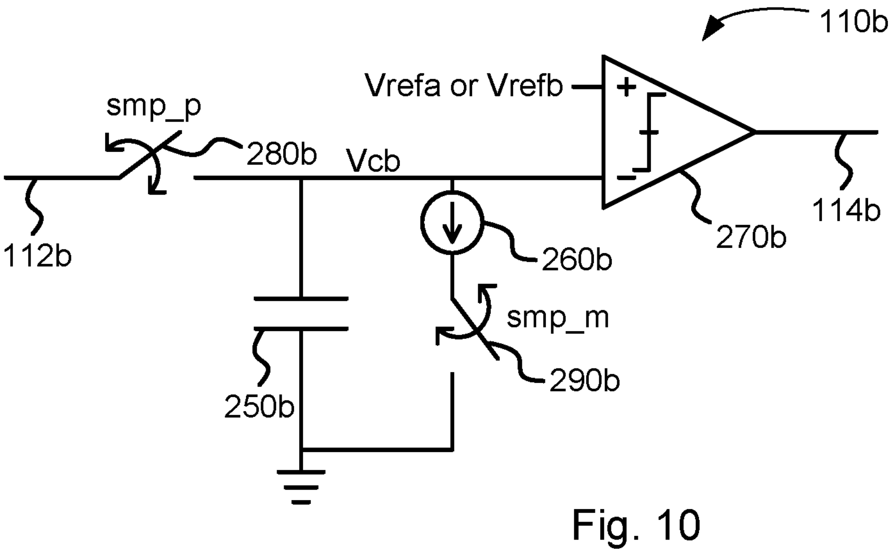
FIG. 10 is a circuit diagram of a VTC.

An example of such a configuration of the second VTC 110*b* is illustrated in FIG. 10, where the first reference voltage Vrefa or the second reference voltage Vrefb is provided to the positive input of the second comparator circuit 270*b*. In FIG. 10, one terminal of the second capacitor 250*b* is connected to the signal ground node. Furthermore, in FIG. 10, the other terminal of the second capacitor 250*b* is connected to a negative input of the second comparator circuit 270*b*. Moreover, in FIG. 10, a sampling switch 280*b* is connected between the input terminal 112*b* of the second VTC 110*b* and the negative input terminal of the second comparator circuit 270*b*. The sampling control signal smp_p controls the sampling switch 280*b* a such that, for each sample, the sampling switch 280*b* is closed during said first phase of operation and open during said second phase of operation. As above, for the embodiment illustrated in FIG. 10, the voltage Vb provided at the input terminal 112*b* of the second VTC 110*b* can be either time continuous or time discrete (e.g. piecewise constant). In the case of a time-continuous voltage Vb, said sample Vb[n] is the value of Vb at the end of the first phase of operation.

In FIG. 10, the second current source 260*b* is connected in series with a switch 290*b* between the negative input of the second comparator circuit 270*b* and the signal ground node. The control signal smp_m controls the switch 290*b* such that, for each sample, the switch 290*b* is open during said first phase of operation and closed during said second phase of operation. Thereby, during the second phase of operation, the second capacitor 250*b* is gradually discharged and the voltage Vcb across the second capacitor is thus gradually reduced. When it reaches below the first reference voltage Vrefa or the second reference voltage Vrefb (i.e. the one of Vrefa and Vrefb that is actually used in the embodiment), a transition is made at the output of the second comparator circuit 270*b*, which is the start of the second pulse P2.

In FIGS. 8 and 10, the current sources 260*a* and 260*b* are coupled, via the switches 290*a* and 290*b*, respectively, to the same signal ground node as the capacitors 250*a* and 250*b*. However, in other embodiments, they may be coupled to different nodes than the signal ground node that the capacitors 250*a* and 250*b* are connected to. Furthermore, in some embodiments, the polarity of the current sources 260*a* and 260*b* may be reversed, so that they are configured to charge the capacitors 250*a* and 250*b* instead. Then the voltages Vca and Vcb will be gradually increased instead of being gradually reduced during the second phase of operation, and will pass through the respective reference voltages Vrefa or Vrefb from below rather than from above. The general principle of operation is the same for these embodiments with reversed polarity compared with what is illustrated in the drawings.

In the following, a particular embodiment of the ADC 50 is described. According to this embodiment, the ADC 50 comprises the first and the second VTC 110*a*, 110*b*, each having an input terminal 112*a*, 112*b* and an output terminal 114*a*, 114*b*. Each of the first VTC 110*a* and the second VTC 110*b* comprises a sampling capacitor (corresponding to the first capacitor 250*a* in FIG. 8 and the second capacitor 250*b* in FIG. 10, respectively) having a first terminal and a second terminal, wherein the second terminal is connected to a signal ground node. Furthermore, each of the first VTC 110*a* and the second VTC 110*b* comprises a sampling switch (corresponding to the sampling switch 280*a* in FIG. 8 and the sampling switch 280*b* in FIG. 10, respectively) connected between the input terminal 112*a*, 112*b* of the VTC 110*a*, 110*b* and the first terminal of the sampling capacitor 250*a*, 250*b*. Moreover, each of the first VTC 110*a* and the second VTC 110*b* comprises a charge-transfer circuit comprising a series connection of a current source (corresponding to the first current source 260*a* in FIG. 8 and the second current source 260*b* in FIG. 10, respectively) and a switch (corresponding to the switch 290*a* in FIG. 8 and the switch 290*b* in FIG. 10, respectively) connected to the first terminal of the capacitor 250*a*, 250*b* (e.g. between the first terminal of the capacitor 250*a*, 250*b* and the signal ground node as in FIGS. 8 and 10, or between the first terminal of the capacitor 250*a*, 250*b* and some other node, as discussed above). Each of the first VTC 110*a* and the second VTC 110*b* further comprises a comparator circuit (corresponding to the first comparator circuit 270*a* in FIG. 8 and the second comparator circuit 270*b* in FIG. 10, respectively) having a first input terminal connected to the first terminal of the capacitor 250*a*, 250*b*, a second input terminal configured to receive a reference voltage, and an output terminal connected to the output terminal 114*a*, 114*b* of the VTC 110*a*, 110*b*. As described above, said reference voltage may be the same (Vrefa) in both VTCs 110*a* and 110*b*, or different (Vrefa in the first VTC 110*a* and Vrefb in the second VTC 110*b*). According to the embodiment, the ADC 50 further comprises a pulse-detector circuit 120 as described above with reference to FIGS. 6 and 7. The pulse-detector circuit 120 comprises the first flip-flop 200*a* and the second flip-flop 200*b*, each having a data input "D", a clock input "clk", a reset input "reset", and an output "Q". The output "Q" of each of the first and second flip-flop 200*a*, 200*b* can be in the first logic state ('0') or the second logic state ('1'). Each of the first and the second flip-flop 200*a*, 200*b* is configured to reset its output "Q" to the first logic state ('0') in response to a reset signal at its reset input "reset". Furthermore, the pulse-detector circuit 120 comprises the logic circuit 210 having the first input 212*a*, the second input 212*b*, and the output 214. The data input "D" of each of the first flip-flop 200*a* and the second flip-flop 200*b* is configured to receive a constant signal corresponding to the second logic state ('1'). The clock input "clk" of the first flip-flop 200*a* is connected to the output terminal 114*a* of the first VTC 110*a*. The clock input "clk" of the second flip-flop 200*b* is connected to the output terminal 114*b* of the second VTC 110*b*. The output "Q" of the first flip-flop 200*a* is connected to the first output 124*a* of the pulse-detector circuit 120. The output "Q" of the second flip-flop 200*b* is connected to the second output 124*b* of the pulse-detector circuit 120. The first input 212*a* of the logic circuit 210 is connected to the output "Q" of the first flip-flop 200*a*. The second input 212*b* of the logic circuit 210 is connected to the output "Q" of the second flip-flop 200*b*. The output 214 of the logic circuit 210 is connected to the reset inputs "reset" of the first and the second flip-flop 200*a*, 200*b*. The logic circuit 210 is configured to generate the reset signal at its output 214 in response to both of its first input 212*a* and its second input 212*b* being set in the second logic state ('1'). In addition, as described above with reference to FIG. 7, the logic circuit 210 may have the third input 212*c* configured to receive said reset pulse (which may e.g. be the same as the sampling control signal smp_p described above), and may be configured to generate the reset signal at its output 214 also in response to receiving the reset pulse at its third input 212*c*. Furthermore, according to the embodiment, the ADC 50 also comprises the first TDC 130*a* connected to the first output 124*a* of the pulse-detector circuit 120 and the second TDC 130*b* connected to the second output 124*b* of the pulse-detector circuit 120.

There are various options for implementing the TDCs 130*a* and 130*b* in the embodiments disclosed herein. For example, oscillator-based TDCs or Vernier-type TDCs may be used. According to some embodiments, each of the first TDC 130*a* and the second TDC 130*b* is a pulse-shrinking TDC. In a pulse-shrinking TDC, the pulse whose duration is to be measured (below referred to as "the pulse to be measured") is fed into a chain of pulse-shrinking elements. Each of the pulse-shrinking elements receives an input pulse and outputs an output pulse that has duration that is reduced with a certain amount of time compared with the input pulse. This can e.g. be accomplished by designing the pulse-shrinking elements, or components therein, to have different rise and fall times. The output pulse is input to a next pulse-shrinking element in the chain as an input pulse (except for the last pulse-shrinking element in the chain). As the pulse propagates along the chain of pulse-shrinking elements, the pulse duration will become shorter and shorter, and at some point, the pulse will vanish (unless the pulse to be measured is long enough to allow the pulse to propagate through all elements in the chain). The number of pulse-shrinking elements that the pulse propagates through before vanishing is a metric of the duration of the pulse to be measured.

Figure 11:
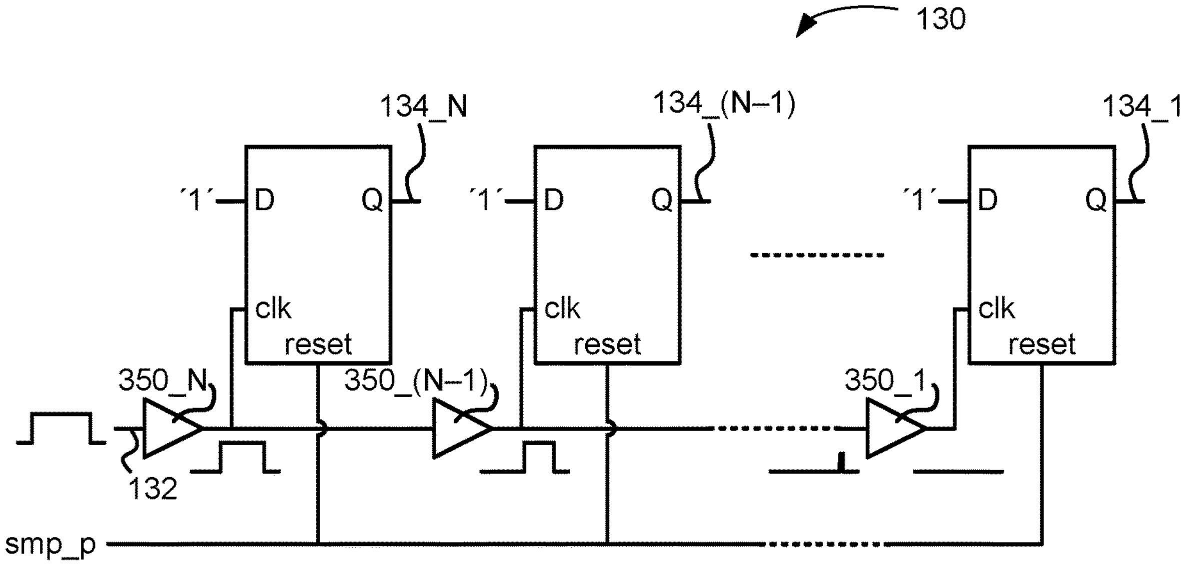
FIG. 11 is a circuit diagram of a pulse-shrinking TDC.

An example of a pulse-shrinking TDC 130 is shown in FIG. 11. The reference number 130 is used in FIG. 11 as a generic reference number representing both the first TDC 130*a* and the second TDC 130*b* (i.e. they can both be implemented in the same way). In the same way, the reference number 132 is used in FIG. 11 as a generic reference number representing both the input 132*a* of the first TDC 130*a* and the input 132*b* of the second TDC 130*b*. Similarly, the reference number 134 is used in FIG. 11 as a generic reference number representing both the output 134 of the first TDC 130*a* and the output 134*b* of the second TDC 130*b*.

In FIG. 11, the output 134 has N bits 134_1-134_N. Furthermore, the pulse-shrinking TDC 130 in FIG. 11 comprises N flip-flops of the type described in the context of the embodiments of the pulse-detector circuit 120 illustrated in FIGS. 6-7. Moreover, in FIG. 11, the pulse-shrinking TDC 130 comprises a chain of N pulse-shrinking elements 350_1-350_N. The output "Q" of each flip-flop is connected to a unique one of the N bits 134_1-134_N of the output 134 of the pulse-shrinking TDC 130. Furthermore, the clock input "clk" of each flip-flop is connected to the output of a unique one of pulse-shrinking elements 350_1-350_N. Moreover, the reset input "reset" of all flip-flops is driven by the sampling-control signal smp_p, whereby, for each sample, the outputs "Q" of all flip-flops are initially reset to the first logic state ('0'). The data inputs "D" of all flip-flops are set to the second logic state ('1'). As the pulse provided at the input 132 (from the pulse-detector circuit 120) propagates along the chain of pulse-shrinking elements 350_1-350_N, the outputs "Q" of a number of flip-flops, namely those whose clock inputs are connected to outputs of the pulse-shrinking elements that the pulse propagates through before vanishing, will be set to the second logic state ('1'). The output bits 134_1-134_N thus provide a thermometer-coded digital representation of the duration of the pulse provided at the input 132. Pulse-shrinking TDCs are known in the art of time-to-digital conversion, and the functionality is not described in any further detail herein.

An advantage of pulse-shrinking TDCs is that they have a relatively low energy consumption. For most pulse-durations, only a subset of the flip-flops will be reached by a pulse at its clock input "clk" and contribute to the dynamic energy consumption of the TDC. However, the inventors have identified the pulse-shrinking TDC as one of the types of TDCs that suffer from relatively poor linearity when the duration to be converted is relatively short, as mentioned above. This problem is alleviated with the use of the pulse-detector circuit 120, which, as mentioned above, provides a guaranteed minimum duration of the pulses that are input to the TDCs 130*a* and 130*b*.

Figure 12:
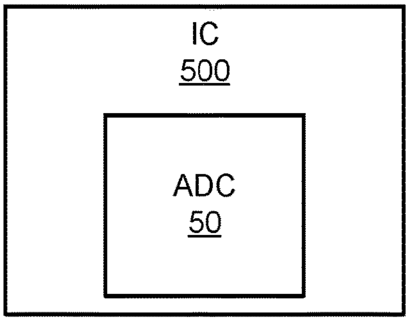
FIG. 12 illustrates an integrated circuit comprising an ADC.

The embodiments of the ADC 50 described herein are suitable for integration on an integrated circuit (IC). Thus, according to some embodiments, there is provided an IC 500 comprising the ADC 50, as schematically illustrated in FIG. 12.

The disclosure above refers to specific embodiments. However, other embodiments than the above described are possible within the scope of the invention. For example, the circuitry used in embodiments of the pulse-detector circuit 120 shown in FIGS. 6 and 7 can also be used as phase detectors in phase-locked loop (PLL). Other types of circuitry that are used in phase-detectors in PLLs may thus be used to implement the pulse-detector circuit 120 in embodiments of the ADC 50. Furthermore, the ADC 50 may be used in other types of electronic apparatuses than communication apparatuses. The different features of the embodiments may be combined in other combinations than those described.

The invention claimed is:

1. An analog-to-digital converter (ADC) for converting samples of a differential input voltage, formed by pairs of concurrent samples of a first input voltage (Va[n]) and a second input voltage (Vb[n]), the ADC comprising:

- a differential input port comprising a first input terminal configured to receive the first input voltage (Va[n]) and a second input terminal configured to receive the second input voltage (Vb[n]);
- a first voltage-to-time converter (VTC) configured to receive the first input voltage (Va[n]);
- a second VTC configured to receive the second input voltage (Vb[n]);
- a pulse-detector circuit coupled to outputs of the first VTC and the second VTC and having a first output and a second output;
- a first time-to-digital converter (TDC) coupled to the first output of the pulse-detector circuit; and
- a second TDC coupled to the second output of the pulse-detector circuit;

wherein for each pair of concurrent samples (Va[n], Vb[n]) of the first input voltage (Va[n]) and the second input voltage (Vb[n]):

- the first VTC is configured to generate a first pulse (P1) delayed an amount of time (td1) corresponding to the magnitude of the sample of the first input voltage (Va[n]);
- the second VTC is configured to generate a second pulse (P2) delayed an amount of time (td2) corresponding to the magnitude of the sample of the second input voltage (Vb[n]);
- the pulse-detector circuit is configured to:
  - make a transition from a first logic state ('0') to a second logic state ('1') at the first output of the pulse-detector circuit in response to the start of the first pulse (P1);
  - make a transition from the first logic state ('0') to the second logic state ('1') at the second output of the pulse-detector circuit in response to the start of the second pulse (P2); and
  - in response to both the first output and the second output of the pulse-detector circuit being set in the second logic state ('1'), reset both the first and the second output to the first logic state ('0'); whereby
  - a third pulse (P3) is generated at the first output of the pulse-detector circuit and a fourth pulse (P4) is generated at the second output of the pulse-detector circuit;
- the first TDC is configured to receive the third pulse (P3) and generate a first digital value (xa[n]) corresponding to the duration of the third pulse (P3); and
- the second TDC is configured to receive the fourth pulse (P4) and generate a second digital value (xb[n]) corresponding to the duration of the fourth pulse (P4).

2. The ADC of claim 1 wherein the first digital value (xa[n]) and the second digital value (xb[n]) form an output sample of the ADC.

3. The ADC of claim 1 wherein the ADC comprises a circuit configured to generate an output sample (x[n]) of the ADC in response to the first digital value (xa[n]) and the second digital value (xb[n]).

4. The ADC of claim 3, wherein the output sample (x[n]) is the difference between the first digital value (xa[n]) and the second digital value (xb[n]).

5. The ADC of claim 1, wherein each of the first TDC and the second TDC is a pulse-shrinking TDC.

6. The ADC of claim 1, wherein the pulse-detector circuit comprises a first flip-flop and a second flip-flop, each having a data input (D), a clock input (clk), a reset input (reset), and an output (Q), wherein

- the data input (D) of each of the first flip-flop and the second flip-flop is configured to receive a constant signal corresponding to the second logic state ('1');
- the clock input (clk) of the first flip-flop is configured to receive the first pulse (P1);
- the clock input (clk) of the second flip-flop is configured to receive the second pulse (P2);
- the output (Q) of the first flip-flop is connected to the first output of the pulse-detector circuit;
- the output (Q) of the second flip-flop is connected to the second output of the pulse-detector circuit; and
- the pulse-detector circuit comprises a logic circuit having a first input connected to the output (Q) of the first flip-flop, a second input connected to the output (Q) of the second flip-flop, and an output connected to the reset inputs (reset) of the first flip-flop and the second flip-flop for resetting the first flip-flop and the second flip-flop in response to the outputs (Q) of both the first flip-flop and the second flip-flop being set in the second logic state ('1').

7. The ADC of claim 6, wherein the logic circuit is further configured to reset the first flip-flop and the second flip-flop in response to a reset pulse.

8. The ADC of claim 7, comprising circuitry configured to provide said reset pulse in preparation of converting each sample.

9. The ADC of claim 1, wherein the first VTC comprises:

a first capacitor configured to, for each sample of the first input voltage (Va[n]), be charged to the voltage value of that sample of the first input voltage (Va[n]) during a first phase of operation;

a first current source configured to discharge or charge the first capacitor during a subsequent second phase of operation;

a first comparator circuit configured to compare the voltage (Vca) across the first capacitor with a first reference voltage (Vrefa) and to generate the first pulse (P1) at an output of the first comparator circuit.

10. The ADC of claim 9, wherein the second VTC comprises:

a second capacitor configured to, for each sample of the second input voltage (Vb[n]), be charged to the voltage value of that sample of the second input voltage (Vb[n]) during the first phase of operation;

a second current source configured to discharge or charge the second capacitor during the second phase of operation;

a second comparator circuit configured to compare the voltage (Vcb) across the second capacitor with the first or a second reference voltage (Vrefa, Vrefb) and to generate the second pulse (P2) at an output of the second comparator circuit.

11. A receiver circuit comprising the ADC of claim 1.

12. An electronic apparatus comprising the ADC of claim 1.

13. The electronic apparatus of claim 12, wherein the electronic apparatus is a communication apparatus.

14. The electronic apparatus of claim 13, wherein the communication apparatus is a wireless communication device for a cellular communications system.

15. The electronic apparatus of claim 13, wherein the communication apparatus is a base station for a cellular communications system.

16. An analog-to-digital converter (ADC) comprising:

a first and a second voltage-to-time converter (VTC), each having an input terminal and an output terminal, and each comprising:

a sampling capacitor having a first terminal and a second terminal, wherein the second terminal is connected to a signal ground node;

a sampling switch connected between the input terminal of the VTC and the first terminal of the sampling capacitor;

a charge-transfer circuit comprising a series connection of a current source and a switch connected to the first terminal of the capacitor; and a comparator circuit having a first input terminal connected to the first terminal of the capacitor, a second input terminal configured to receive a reference voltage (Vrefa, Vrefb), and an output terminal connected to the output terminal of the VTC;

a pulse-detector circuit comprising:

a first flip-flop and a second flip-flop, each having a data input (D), a clock input (clk), a reset input (reset), and an output (Q), wherein the output (Q) of each of the first and second flip-flop can be in a first logic state ('0') or a second logic state ('1') and each of the first and the second flip-flop is configured to reset its output (Q) to the first logic state ('0') in response to a reset signal at its reset input (reset); and a logic circuit having a first input, a second input, and an output;

wherein the data input (D) of each of the first flip-flop and the second flip-flop is configured to receive a constant signal corresponding to the second logic state ('1');

wherein the clock input (clk) of the first flip-flop is connected to the output terminal of the first VTC;

wherein the clock input (clk) of the second flip-flop is connected to the output terminal of the second VTC;

wherein the output (Q) of the first flip-flop is connected to a first output of the pulse-detector circuit;

wherein the output (Q) of the second flip-flop is connected to a second output of the pulse-detector circuit;

wherein the first input of the logic circuit is connected to the output (Q) of the first flip-flop, the second input of the logic circuit is connected to the output (Q) of the second flip-flop, and the output of the logic circuit is connected to the reset inputs (reset) of the first and the second flip-flop;

wherein the logic circuit is configured to generate the reset signal in response to both of its first input and its second input being set in the second logic state ('1');

a first time-to-digital converter, TDC, connected to the output of the first flip-flop of the pulse-detector circuit; and a second TDC connected to the output of the second flip-flop of the pulse-detector circuit.

17. An integrated circuit comprising the ADC of claim 16.

18. An electronic apparatus comprising the ADC of claim 16.

19. The electronic apparatus of claim 18, wherein the electronic apparatus is a communication apparatus.

20. The electronic apparatus of claim 19, wherein the communication apparatus is a wireless communication device for a cellular communications system or a base station for a cellular communications system.

* * * * *